United States Patent [19]

Parmerlee et al.

[11] 4,315,300
[45] Feb. 9, 1982

[54] COOLING ARRANGEMENT FOR PLUG-IN MODULE ASSEMBLY

[75] Inventors: James K. Parmerlee; B. Dale Tague, both of Indianapolis, Ind.

[73] Assignee: The United States of America as represented by the Secretary of the Navy, Washington, D.C.

[21] Appl. No.: 7,524

[22] Filed: Jan. 29, 1979

[51] Int. Cl.³ .............................................. H05K 7/20
[52] U.S. Cl. .................................. 361/382; 361/384; 361/385; 165/80 B
[58] Field of Search ........................... 211/41; 62/418; 174/15 R, 16 R, 16 HS; 361/381, 382, 383–389, 415; 165/DIG. 16, 80, 105, 185

[56] References Cited

U.S. PATENT DOCUMENTS

| | | | |
|---|---|---|---|
| 3,268,772 | 8/1966 | Kamel | 361/383 |
| 3,298,195 | 1/1967 | Raskhodoff | 62/418 |
| 3,631,325 | 12/1971 | Wenz | 361/386 |
| 3,925,710 | 12/1975 | Ebert | 361/383 |
| 3,967,874 | 7/1976 | Calabio | 361/384 |
| 4,093,971 | 6/1978 | Chu | 361/385 |

Primary Examiner—Gerald P. Tolin

[57] ABSTRACT

An improved cooling arrangement for an electronic plug-in module assembly having a plurality of modules supported in grooves in a pair of parallel sides. Each parallel side is provided with fluid passageways for carrying a cooling liquid for removing heat transferred from a heat sink on each module to the sides. A plurality of apertures are provided in each side between adjacent grooves and carry fins through which cool air is blown to cool each side of each plug-in module.

5 Claims, 5 Drawing Figures

COOLING ARRANGEMENT FOR PLUG-IN MODULE ASSEMBLY

BACKGROUND OF THE INVENTION

The present invention relates to an improved cooling arrangement for standard electronic modules which are slidably mounted in grooves or ways in a chassis.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, the Department of the Navy, as well as other military branches, have been engaged in a standard hardware program in which electronic plug-in modules have been developed which are capable of meeting various system requirements. One such plug-in module is shown in U.S. Pat. No. 3,243,660, entitled "Electronic Module Assembly", which issued Mar. 29, 1966, to Leonard J. Yuska and David P. Zimmerman.

One concept of a standard hardware program is to have a plurality of modules which plug in a chassis to form an assembly and normally these plug-in modules slide in grooves or ways in the chassis and engage a mating female connector. These modules are closely assembled and dissipate a lot of heat which, if not removed, greatly affects component reliability.

Various attempts have been made to cool electronic assemblies and generally employ some type of cooling coil and fan assembly. One such device is shown in U.S. Pat. No. 2,187,011, entitled "Cooling Means For An Electrical Apparatus", which issued Jan. 16, 1940, to Paul F. Braden. In one embodiment of this patent, a fan blows air over a cooling coil and the air passes successively through three shelves which support vacuum tubes and other electrical components. The disadvantage of such an arrangement, however, is that the first shelf receives cool air, which is heated by the electrical components, and the last shelf receives hot air and experiences little or no cooling effect.

In U.S. Pat. No. 3,942,586, entitled, "Cooling Arrangement For Flat Semiconductor Components", which issued Mar. 9, 1976, to Paul Fries, the inventor recognized a need for cooling all the mounted components. He stated that there is a need for an improved cooling arrangement for stacked flat semiconductors which can: (1) take advantage of the benefits of the heat pipe; and (2) in addition, provide adequate cooling to the semiconductors no matter what their location is within the column or stack. That is, the problem is to provide an arrangement in which cooling air of essentially the same temperature can flow over all the heat pipes in such an arrangement. The solution proposed was to axially align the semi-conductor components, with the axes of the heat pipes of the cooling elements which are located one over the other, arranged so that they are rotationally displaced with respect to each other about the stack axis.

SUMMARY OF THE INVENTION

The present invention provides an improved cooling arrangement for a standard electronic plug-in module assembly having a plurality of standard modules supported in grooves in a pair of parallel sides. Each module has a metallic heat plate which facilitates the transfer of heat from the electronic components to the parallel metallic sides which support the modules. Each parallel side is provided with fluid passageways for carrying a cooling liquid for removing heat transferred from the modules by way of the heat sink. An aperture is provided between adjacent grooves in both the sides and fins are provided in these apertures through which cool air is blown to cool each side of each plug-in module. Each module receives cool air at the same temperature as the temperature of the air cooling the other modules.

It is therefore a general object of the present invention to provide an improved cooling arrangement for an electronic plug-in module assembly.

Other objects and advantages of the present invention will be readily appreciated as the same becomes better understood by reference to the following detailed description when considered in connection with the accompanying drawings.

DESCRIPTION OF THE PREFERRED EMBODIMENT

Figure 1:
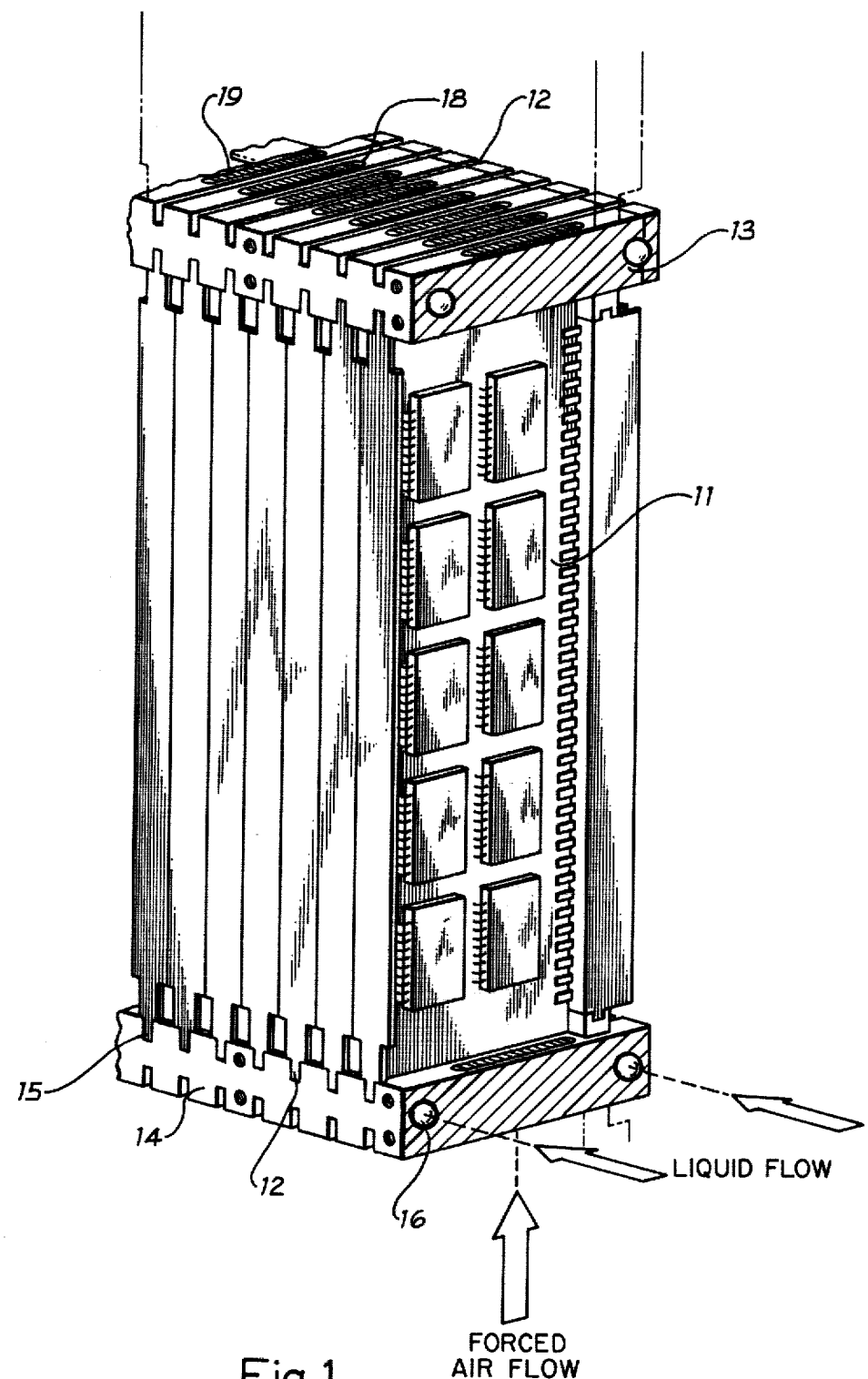
FIG. 1 is a pictorial view showing part of a module assembly.

Referring now to the drawings, and particularly to FIG. 1, there is shown a plurality of plug-in modules 11 supported in grooves 12 in two parallel side plates 13 and 14. The plug-in modules 11 are of the type described in the above-mentioned U.S. Pat. No. 3,243,660. Each module is comprised of a frame which is a sheet metal piece with a bent over lip at the top in the shape of an inverted "L" or a "T". A connector, which by way of example might have either 40 or 100 pins arranged in two parallel rows, is attached to the frame, as by bonding. A flange 15 is provided on each end of the frame and flange 15 is adaptable for sliding into a groove 12 whereby side plates 13 and 14 support the plugged-in module.

Figure 4:
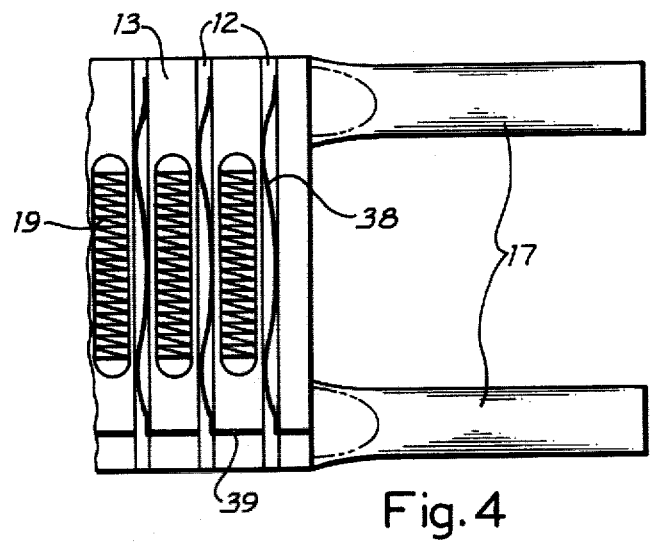
FIG. 4 is a partial top view of one supporting side.
Figure 5:
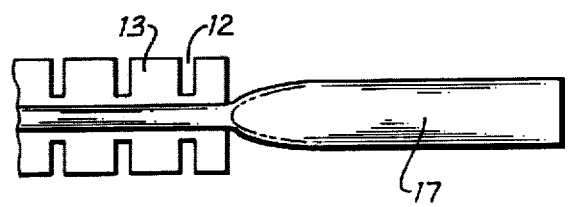
FIG. 5 is a side view of the side shown in FIG. 4.

In the embodiment shown in FIG. 1 of the drawings, a pair of holes 16 are bored the entire length of each side plate and are arranged to carry a cooling liquid, such as a 62% glycol-38% water solution, which is circulated through the side plates. FIGS. 4 and 5 of the drawings show another embodiment for carrying coolant through each side plate. A pair of tubes 17 are flattened in a middle section and each tube is attached, as by brazing or soldering, in a slot cut into the side plate.

A through slot 18 is provided between adjacent grooves 12 and a thin reverse-bended baffle 19 is mounted in each slot 18. Cool air is directed through these slots and this air moves across the faces of the modules to facilitate the removal of heat. It can be seen that each module receives a quantity of air which is at the same temperature for all the modules.

Figure 2:
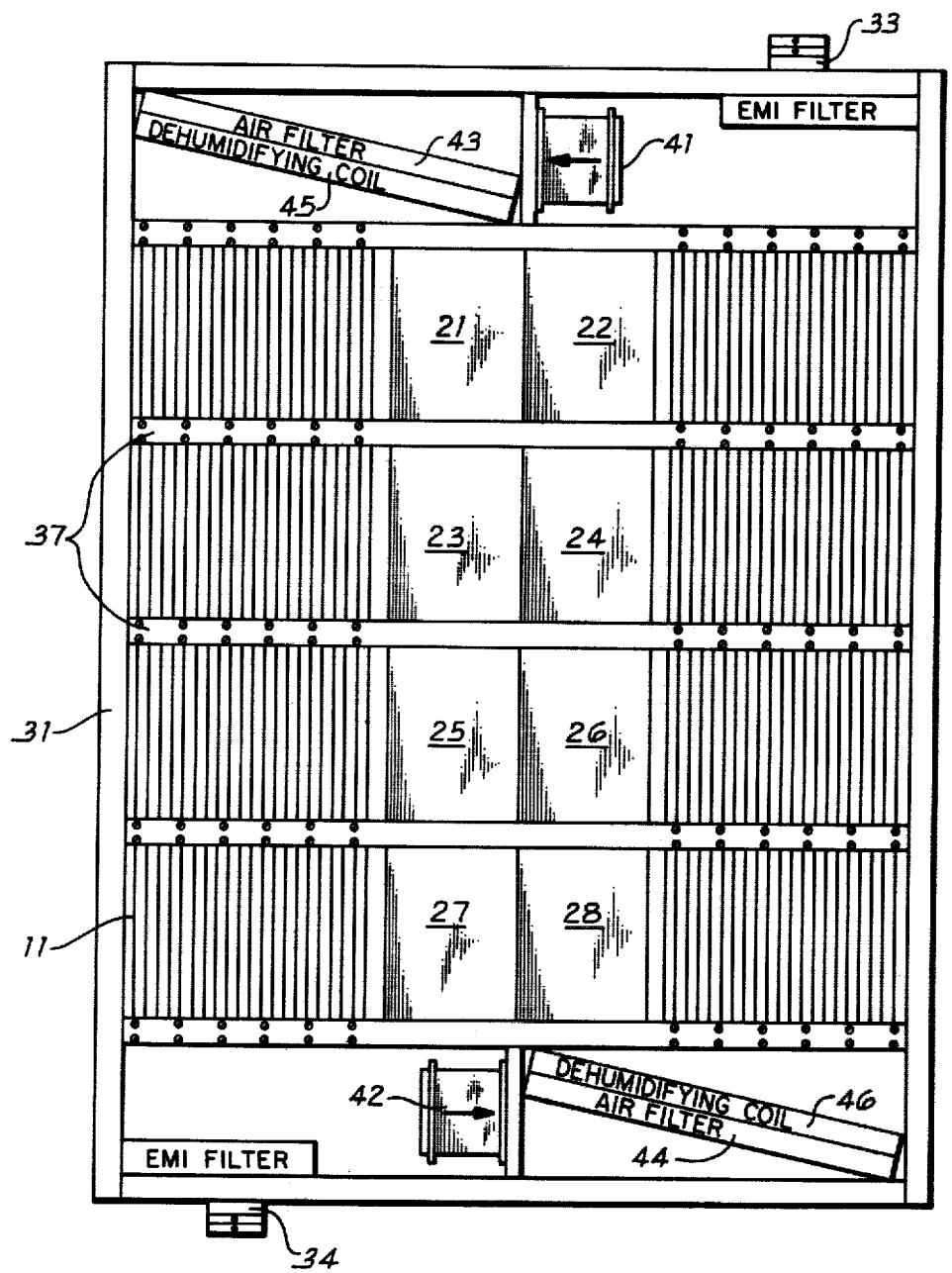
FIG. 2 is a plan view showing a full module assembly.
Figure 3:
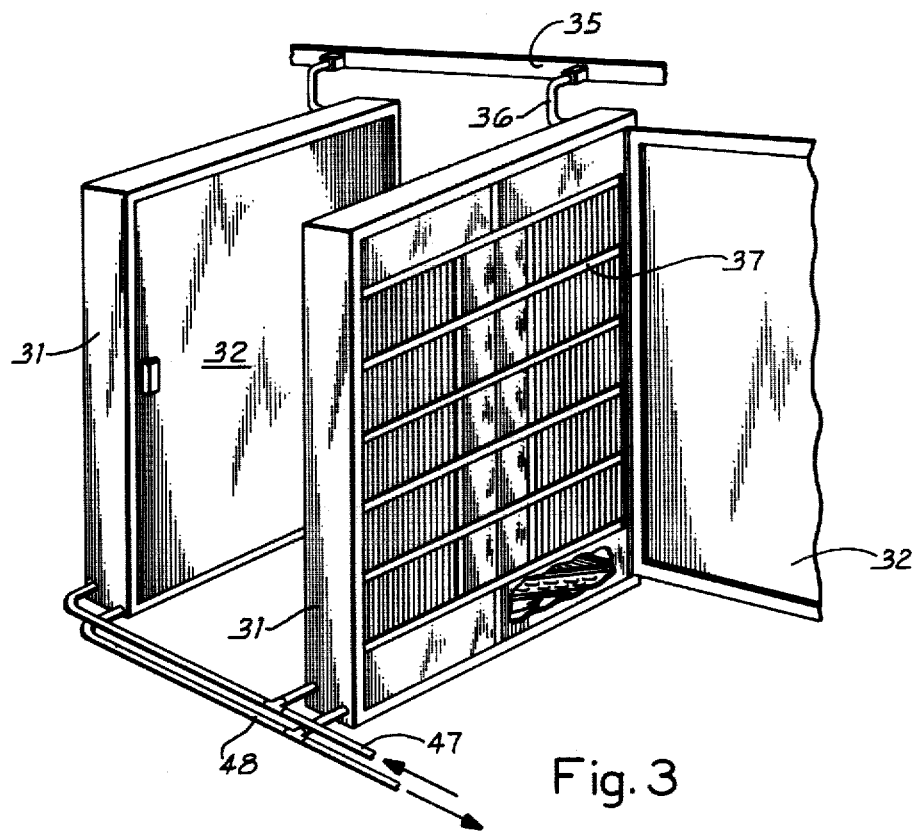
FIG. 3 is a view, partly broken away, showing modules arranged in an aircraft fuselage.

Referring now to FIGS. 2 and 3 of the drawings, there is shown an arrangement of avionic equipment which is designed to be mounted in a military aircraft. The specific arrangement is for an airborne computer, but such an arrangement, with modifications thereto, can be utilized for many different kinds of electronic equipment. The specific arrangement shown in FIGS. 2 and 3, has a multiple number of power supplies which have been numbered 21 through 28, and 200 plug-in modules 11 are shown, these being arranged in groups of twenty-five. The power supplies and plug-in modules are carried in a closed housing 31 and access thereto is provided by means of a hinged door 32. Electrical connection is made by connectors 33 and 34 which are attached to housing 31 and the units are connected to a bus 35 through an electrical cable 36. Hold-down bars 37 are provided for locking plug-in modules 11 with the side plates. By way of example, a hold-down bar 37 might be the same width as a side plate so that one bar 37 engages the ends of adjacent groups of plug-in modules 11, and bars 37 might be attached by screws to a particular side plate. As best shown in FIG. 4 of the drawings, an undulant-shaped spring 38 is provided in each groove 12 for biasing the flange 15 on the frame into contact with a side in groove 12. Spring 38, in addition to removing any free-play due to manufacturing tolerances, also facilitates maximum heat transfer from the frame to the side plate. Each spring 38 is retained by inserting one end in a slot 39 in the side plate.

Referring now to FIGS. 2 and 3 of the drawings, fans 41 and 42 are provided in the top and bottom of housing 31 and circulate air through slots 18 and over modules 11. As best shown in FIG. 2 of the drawings, air filters 43 and 44 and dehumidifying coils 45 and 46 are associated with fans 41 and 42, respectively, to facilitate the circulation of clean, dry air over modules 11. By way of example, the cool water solution that is pumped through side plates 13 and 14 is passed through dehumidifying coils 45 and 46 and moisture in the circulating air is condensed on coils 45 and 46 and can be collected and removed.

OPERATION

In operation, a plurality of modules 11 are slidably mounted in plates 13 and 14, and spring 38 in each groove 12 biases the module against an edge or groove 12 so that good heat flow will be provided. A supply of cooling water is carried by pipe 47 and this cooling water flows first through dehumidifying coil 46 and then through the side plates 13 and 14. After flowing through all the side plates in rack 31, the water flows through pipe 48 to a cooling station. While water is flowing through side plates, fans 41 and 42 are blowing cool air through slots 18 so that heat is readily removed from the components on modules 11.

It can readily be seen that by blowing cool air across the faces of modules 11 rather than through the modules, each module receives a quantity of cool air and all modules are equally cooled.

Obviously many modifications and variations of the present invention are possible in the light of the above teachings. It is therefore to be understood that the invention may be practiced otherwise than as specifically described.

We claim:
1. A modular electronic system comprising,
a support assembly having first and second side plates each having a plurality of spaced grooves therein,
a plurality of electronic modules each having a metallic frame with the ends of each said metallic frame being slidably mounted in opposed grooves in said first and second side plates,
a plurality of through slots in said first and second side plates, each said slot being positioned between adjacent grooves to provide air passages through said first and second side plates,
means for circulating air through said plurality of slots thereby transferring heat from said electronic modules to said first and second side plates,
a first longitudinal cooling passage in each said side plate positioned above said through slots and behind said spaced grooves and a second longitudinal cooling passage in each said side plate positioned below said through slots and behind said spaced grooves, and
means for circulating cooling liquid through said passages.

2. A modular electronic system as set forth in claim 1 wherein each said groove has a spring for biasing said metallic frame into contact with said side plates.

3. A modular electronic system as set forth in claim 1 wherein each said slot is provided with a reverse-bended baffle for diffusing air passing therethrough.

4. A modular electronic system as set forth in claim 1 wherein said longitudinal passages are bored holes through said side plates.

5. A modular electronic system as set forth in claim 1 wherein said longitudinal passages are tubes attached in slots cut into said side plates.

* * * * *